(12) United States Patent
Bu et al.

(10) Patent No.: US 7,585,768 B2
(45) Date of Patent: Sep. 8, 2009

(54) COMBINED COPPER PLATING METHOD TO IMPROVE GAP FILL

(75) Inventors: Xiaomei Bu, Singapore (SG); Alex See, Singapore (SG); Fan Zhang, Singapore (SG); Jane Hui, Singapore (SG); Tae Jong Lee, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 74 days.

(21) Appl. No.: 11/454,397

(22) Filed: Jun. 16, 2006

(65) Prior Publication Data

US 2007/0293039 A1    Dec. 20, 2007

(51) Int. Cl.
*H01L 21/44* (2006.01)

(52) U.S. Cl. .................. 438/678; 438/687; 438/782; 438/E21.575; 438/E21.597; 438/E21.627; 438/E21.641

(58) Field of Classification Search .......... 438/678, 438/782, 687; 257/E21.575–E21.597, E21.627, 257/E21.641

See application file for complete search history.

(56) References Cited

U.S. PATENT DOCUMENTS

| | | | | |
|---|---|---|---|---|
| 5,674,787 A | * | 10/1997 | Zhao et al. | 438/627 |
| 5,695,810 A | * | 12/1997 | Dubin et al. | 438/643 |
| 5,824,599 A | * | 10/1998 | Schacham-Diamand et al. | 438/678 |
| 6,077,780 A | * | 6/2000 | Dubin | 438/687 |
| 6,197,688 B1 | * | 3/2001 | Simpson | 438/678 |
| 6,254,670 B1 | * | 7/2001 | Erdtmann et al. | 106/31.86 |
| 6,344,129 B1 | | 2/2002 | Rodbell et al. | |
| 6,380,083 B1 | | 4/2002 | Gross | |
| 6,472,023 B1 | | 10/2002 | Wu et al. | |
| 6,492,270 B1 | | 12/2002 | Lou | |
| 6,525,425 B1 | | 2/2003 | Woo et al. | |

* cited by examiner

*Primary Examiner*—N Drew Richards
*Assistant Examiner*—Swapneel Chhaya
(74) *Attorney, Agent, or Firm*—Horizon IP Pte Ltd

(57) ABSTRACT

A method of filling gaps in dielectric layers is disclosed. A wafer is provided having a dielectric layer containing gaps to be filled with copper, some of the gaps, denoted deeper gaps, having aspect ratios so large that filling these gaps with copper using ECP could result in pinhole like voids. A blanket conformal metal barrier layer is formed and the wafer is then submerged in a solution to electroless plate a blanket conformal copper seed layer. A partial filling of deeper gaps with copper reduces the effective aspect ratios of the deeper gaps to the extent that ECP could be used to complete the copper filling of the gaps without forming pinhole like voids. ECP is then used to complete the copper filling of the gaps. The wafer is annealed and CMP performed to planarize the surface, giving rise to a structure in which the gaps are filled with copper and are separated by the dielectric layer.

12 Claims, 3 Drawing Sheets

COMBINED COPPER PLATING METHOD TO IMPROVE GAP FILL

BACKGROUND OF THE INVENTION (1) Field of the Invention

The present invention relates generally to semiconductor integrated circuit processing and more particularly to copper interconnect processing.

(2) Description of Prior Art

As transistor devices continue to shrink in modern technology so do the feature sizes of metal interconnects. Aspect ratios of gaps, such as vias and trenches, which are filled with metal to form interconnections, tend to increase with design rule shrinking. In damascene and dual damascene processes copper, due to properties such as its low resistivity and low susceptibility to electromigration, is often the metal of choice for filling such gaps. An ECP, electro copper plating, process traditionally accomplishes filling of the gaps with copper. Good gap filling and adhesion properties are also achieved in electroless copper plating, but there is a problem in that electroless copper plating is a high-cost and low-throughput process. However, there is also a problem with ECP since it has been found, in both 0.11 and 0.13 micrometer technologies, that pinhole-like voids exist in the copper for ECP filled gaps. These pinhole-like voids are found for aspect ratios greater than about 5:1. FIG. 1 shows such a void, 32, in an ECP filled gap, 4, where the gap width is about 0.16 micrometers and the void diameter is about 0.04 micrometers. Such voids will not only result in yield loss, but also give rise to reliability concerns during electromigration or stressmigration testing.

As is well known, interconnects are formed in multiple levels. Each level containing a dielectric layer, denoted an IMD (intermetal dielectric) layer, a metal layer made up of metal filled trenches and metal vias connecting metal layers. Generally copper interconnect levels are formed by first forming gaps, such as vias and trenches, in a dielectric layer and lining the gaps with a metal barrier layer, which serves to inhibit copper migration. A copper seed layer is then formed over the metal barrier layer to promote proper adhesion. After filling the gap with copper a planarization procedure, which is usually CMP, is performed. Forming a blanket insulator capping layer completes the interconnect level.

Copper interconnects with improved electromigration resistance and low resistivity is disclosed in Woo et al., U.S. Pat. No. 6,525,425. The copper is formed in two stages. First pure copper is deposited and then the gap is filled with doped copper. A method for forming copper dual damascene is shown by Lou in U.S. Pat. No. 6,492,270, which utilizes both electroless copper plating and physical vapor deposition of copper. U.S. Pat. No. 6,472,023 to Wu et al. discloses a method for forming a copper seed layer in copper interconnects using displacement and thus eliminating the need to use CVD or PVD for forming a copper seed layer. U.S. Pat. No. 6,380,083 to Gross teaches a method for forming copper interconnects that contains a dual copper layer composed of a PVD copper layer and an ECP copper layer. U.S. Pat. No. 6,344,129, to Rodbell et al. teach a method for plating copper on electronic substrates and devices in an electroplating solution using either a one step or two step deposition process.

SUMMARY OF THE INVENTION

It is a primary objective of the invention to provide an efficient, economic and reliable method for copper filling of gaps occurring in the manufacture of modern electronic devices. It is further a primary objective of the invention to provide an efficient, economic and reliable method for copper filling of gaps even for gaps with high aspect ratios. It is yet further a primary objective of the invention to provide an efficient, economic and reliable method for copper filling of gaps occurring in dual damascene processes, even for gaps with high aspect ratios.

These objectives are attained in the invention by utilizing features of both electroless copper plating and ECP to achieve gap filling that is free of pinhole-like voids even for high aspect ratio gaps and that is at the same time efficient and economic. In the methods of the invention electroless copper plating is used to form a copper layer sufficient to reduce the gap aspect ratio to a degree so that ECP can be used to complete the gap filling without introducing pinhole-like voids. Thus the low throughput and high cost arising from the electroless copper plating process is minimized. In preferred embodiments of the invention electroless copper plating is used only to the extent that is required to reduce the gap depth sufficiently so that with the reduced depth the aspect ratio has been reduced enough so that pinhole-like voids do not occur when the more efficient and economic ECP process is used to complete the gap filling.

A method of filling gaps in dielectric layers is disclosed. A wafer is provided having a dielectric layer containing gaps to be filled with copper, some of the gaps, denoted deeper gaps, having aspect ratios so large that filling these gaps with copper using ECP could result in pinhole like voids. A blanket conformal metal barrier layer is formed and the wafer is then submerged in a solution to electroless plate a blanket conformal copper seed layer. A partial filling of deeper gaps with copper reduces the effective aspect ratios of the deeper gaps to the extent that ECP could be used to complete the copper filling of the gaps without forming pinhole like voids. ECP is then used to complete the copper filling of the gaps. The wafer is annealed and CMP performed to planarize the surface, giving rise to a structure in which the gaps are filled with copper and are separated by the dielectric layer.

BRIEF DESCRIPTION OF THE DRAWINGS

In the accompanying drawing forming a material part of this description, there is shown.

DESCRIPTION OF THE PREFERRED EMBODIMENTS

Figure 1:
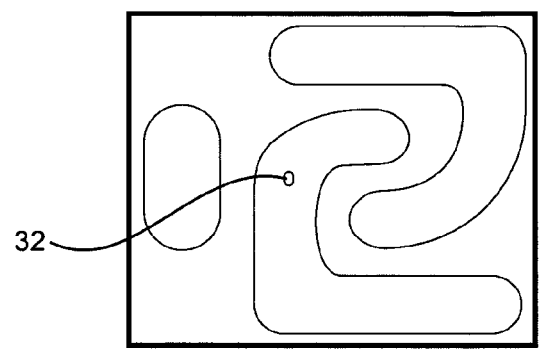
FIG. 1 shows a pinhole-like void in a high aspect ratio gap filled using ECP.
Figure 2:
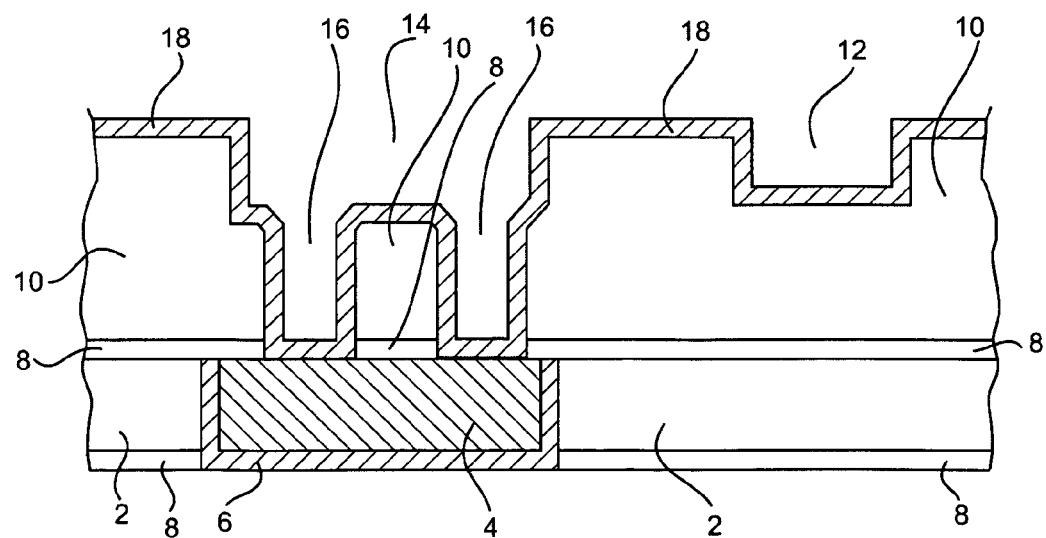
FIGS. 2-6 show a process according to preferred embodiments of the invention.

FIGS. 2-6 illustrate process flows according to preferred embodiments of the invention. Although the figures specifically show preferred embodiments of the invention appropriate for dual damascene, in which a high aspect ratio occurs at the vias, the application to general high aspect ratio gaps is clear to those versed in the art and will be made explicit below. Referring to FIG. 2 there is shown a portion of a wafer containing an IMD layer, 2, including an insulator capping layer, 8 and copper filled trenches, 4, which are lined with a barrier metal layer, 6. The barrier metal layer and insulator capping layer are provided to impede migration of copper, which, as is well known, could have severe detrimental consequences. These layers belong to an nth copper interconnect level, where n is an integer greater or equal to one. Before any processing of the next layer the insulator capping layer, 8, is not as shown in FIG. 2, but extends entirely over the top surface of the nth copper interconnect level. With the aid of FIGS. 2-6, the process, according to preferred embodiments of the invention, of fabricating the next copper interconnect level, the (n+1)th level, will now be described. As a copper interconnect is made up of copper interconnect levels, the description actually provides the details of fabricating a copper interconnect according to preferred embodiments of the invention, once it is given how the first copper interconnect level is formed over the wafer. However, it is an element of the invention that the wafer as provided has a base level, denoted the zero level, containing a base IMD layer disposed between device metal lines and a base blanket insulator capping layer. The base IMD layer is the first IMD layer, which is usually a single damascene structure, while the following layers are usually dual damascene layers. Therefore the first copper interconnect level is formed over the base layer exactly as an (n+1)th copper interconnect level is formed over an nth copper interconnect level.

To fabricate the (n+1)th copper interconnect level a blanket IMD layer, 10, the (n+1)th IMD layer, is formed over the insulator capping layer of the nth copper interconnect level. The IMD layer could be composed of oxide, nitride or oxynitride or of low dielectric constant materials such as polyimide, PTFE, amorphous fluorocarbon or fluorinated $SiO_2$ whose thickness could be between about 0.3 to about 1.5 micrometers. There are abundant conventional processes, which are well known to practitioners of the art, to form IMD layers. Besides trench-first processes, such as those described in detail, there are via first processes that are commonly used for advanced technology beyond 0.13 micrometers. As in conventional dual damascene processes, gaps are formed in two stages. First, the IMD is patterned and etched to form trenches, 12, and the wide portions, 14, of via regions. The depth of regions 12 and 14, which is the depth of the metal lines that fill these regions, is about 0.2 to about 1.5 micrometers. Metal line depths are between about 0.1 to 0.5 micrometers and via regions are between about 0.2 to 1.5 micrometers deep. This patterning and etching can be accomplished conventionally; for example, by forming a photoresist layer over the IMD layer, patterning the photoresist layer and etching to form the regions 12 and 14, and removing the photoresist layer. In the second stage IMD is removed only from via gaps, 16, to the top of the nth copper layer, 4. Thus the nth insulator capping layer, 8, is removed in via gaps so the bottom of via gaps reaches to the top of the nth copper layer, 4. The depth of via gaps is just the difference between the IMD layer thickness and the depth of the trenches, 12. Thus via gap depths are between about 0.2 to about 1.0 micrometers. At via regions the total gap depth is just the thickness of the IMD layer and since line widths in present and near future technologies are between about 0.3 to about 1.5 micrometers, aspect ratios between about 4 to about 10 are to be encountered. As in the first stage, the patterning and etching can be accomplished conventionally. For example, forming a photoresist layer over the IMD layer, patterning the photoresist layer and etching to form the regions 16, and removing the photoresist layer is a conventional process that can accomplish it. A blanket conformal metal barrier layer, 18, is then formed. Metal barrier layer, 18, serves to prevent copper migration and should be comprised out of materials that act as good diffusion barriers. Effective barrier layers are established by layers of between about 50 to about 300 Angstroms comprised of materials such as TiN, Ta or TaN. The structure at this stage of the process is shown in FIG. 2.

Figure 3:
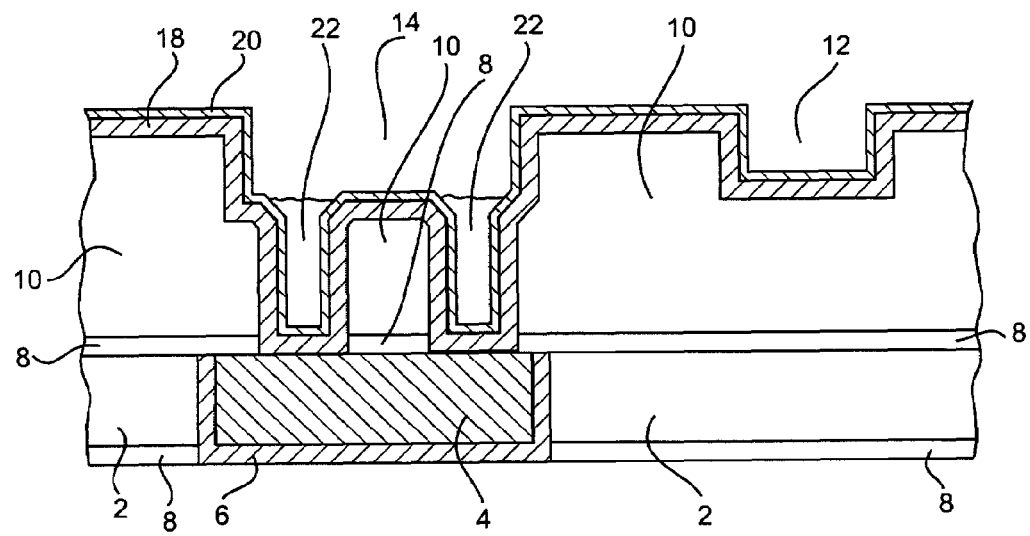
Figure 4:
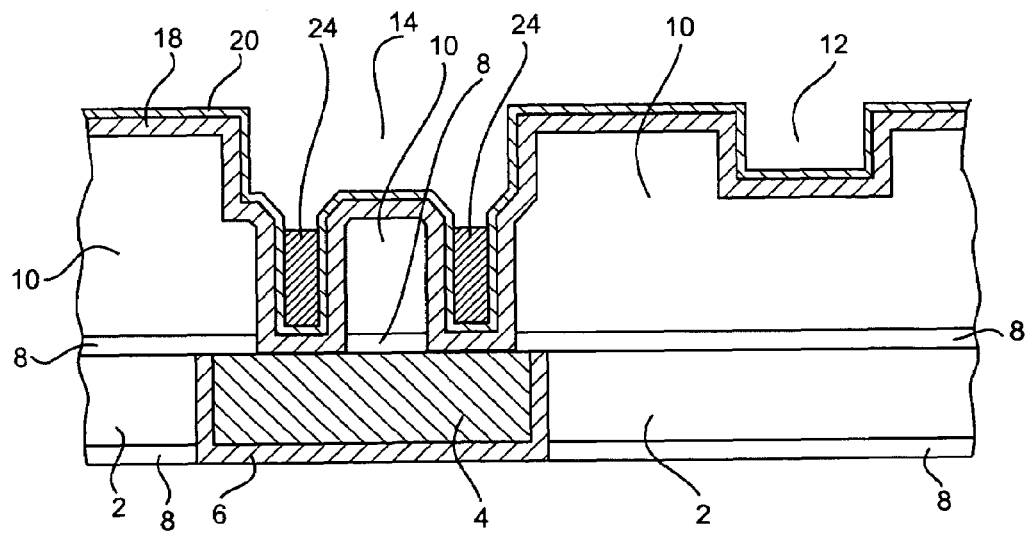
Figure 5:
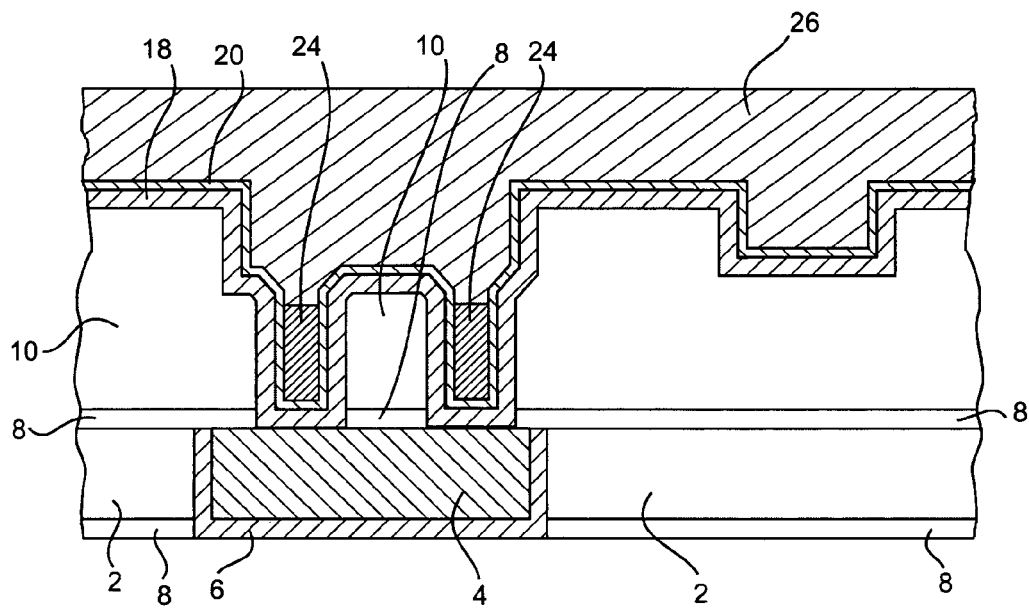
Figure 6:
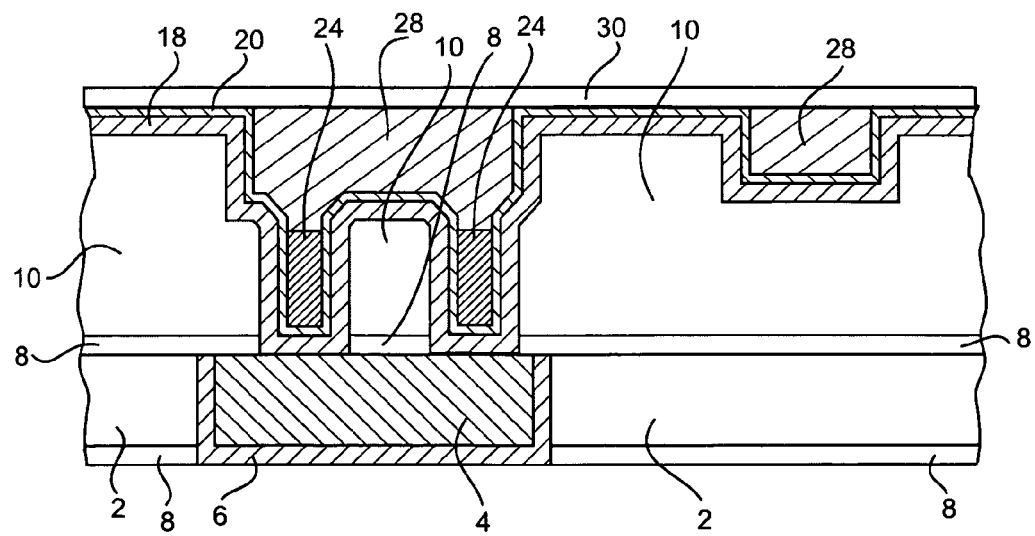

Filling of the gaps with copper commences at this stage. FIGS. 3-5 show the process steps involved, according to preferred embodiments of the invention, in filling the gaps with copper. First, the wafer is submerged in a solution to electroless plate a blanket conformal copper seed layer, 20, whose purpose is to promote adhesion between the bulk copper and the metal barrier layer and to serve as a nucleation layer for ECP Cu plating. In preferred embodiments of the invention the copper seed layer is between about 50 to about 100 Angstroms thick.

Next a partial filling of the deeper portions of gaps, which in the case of dual damascene are the via gap regions 16, is accomplished by electroless plating of copper. This is a crucial step in the invention in which the effective aspect ratios of deeper gaps are reduced so that ECP could be used to complete the copper filling of the gaps. This is important since ECP is the more economical and efficient copper filling process, and with the deeper portions of the gaps partially filled, pinhole like voids will not form. In one embodiment, the partial filling of the deeper portions of gaps is achieved by utilizing water jet technology to blow away plating solution except from regions 16, so that the solution is as indicated by regions 22 in FIG. 3. Water jet technology parameters, i.e. water jet spinning speed and dry $N_2$ blowing cycle, are tuned to achieve a depth for the top of the plating solution so that solution fills the via portions, as indicated by regions 22, and are blown away elsewhere. In a second embodiment, a partial filling of the deeper portions of gaps, which in the case of dual damascene are the via gap regions 6, is accomplished by having the plating solution spun-on. By tuning the speed the plating solution can be arranged to fill only the via gap regions 16, so that the solution is as indicated by regions 22 in FIG. 3.

Performing electroless plating with the solution in the via gap regions, 16, results in a partial copper filling of the via gap regions thus forming electroless copper regions 24 shown in FIG. 4. The thickness of regions 24 should be large enough so that the aspect ratio associated with the trench depth plus the depth of the unfilled gap regions is small enough that pinhole like voids do not form when ECP is used to complete the filling. Performing the ECP process to complete the copper filling forms blanket copper regions 26 as shown in FIG. 5.

A conventional annealing step can now be performed to anneal the copper, in which a temperature of about 150° C. is usually used for duration of about 0.5 hours. A CMP step follows to planarize the surface, giving rise to the copper regions 28. Finally an insulator capping layer 30 is formed to prevent copper migration into the IMD. The insulator capping layer should be comprised of a good diffusion barrier material, such as silicon carbide or silicon nitride of thickness between about 200 to about 800 Angstroms.

While the detailed description of preferred embodiments of the invention is given for the case of dual damascene, in which the high aspect ratio features are associated with via regions, the applicability of the invention for any high aspect ratio gaps is apparent. For lower aspect ratio gaps ECP, being more efficient and economic, is the copper filling process of choice. Electroless copper plating does not give rise to pinhole like voids even for high aspect ratio gaps, but it is a low throughput and high cost process. By utilizing features of both electroless copper plating and ECP, preferred embodiments of the invention provide processes that achieve gap filling that is free of pinhole-like voids even for high aspect ratio gaps and that is at the same time efficient and economic. In the methods of the invention electroless copper plating is used to form a copper layer sufficient to reduce the gap aspect ratio to a degree so that ECP can be used to complete the gap filling without introducing pinhole-like voids. Thus the low throughput and high cost arising from the electroless copper plating process is minimized. In preferred embodiments of the invention electroless copper plating is used only to the extent that is required to reduce the gap depth sufficiently so that with the reduced depth the aspect ratio has been reduced enough so that pinhole-like voids do not occur when the more efficient and economic ECP process is used to complete the gap filling.

Thus, a wafer is provided having a dielectric layer containing gaps to be filled with copper, some of the gaps having aspect ratios so large that filling these gaps with copper using ECP could result in pinhole like voids. A blanket conformal metal barrier layer is first formed that serves to prevent copper migration and should be comprised out of materials that act as good diffusion barriers. Effective barrier layers are established by layers of between about 50 to about 300 Angstroms comprised of materials such as TiN, Ta or TaN.

Filling of the gaps with copper commences with submerging the wafer in a solution to electroless plate a blanket conformal copper seed layer whose purpose is to promote adhesion between the bulk copper and the metal barrier layer and to serve as a nucleation layer for ECP copper. In preferred embodiments of the invention the copper seed layer is between about 50 to about 100 Angstroms thick. Next a partial filling of the deeper gaps is accomplished by electroless plating of copper. Deeper gaps are those that could give rise to pinhole like voids when conventional ECP is used as the copper filling process. This partial filling step is a crucial step in the invention. In this step the effective aspect ratios of deeper gaps are reduced so that ECP could be used to complete the copper filling of the gaps. This is important since ECP is the more economical and efficient copper filling process, and with deeper gaps already partially filled pinhole like voids will not form. There are two options for achieving a partial filling of the deeper gaps. One way is to utilize water jet technology to blow away plating solution except from the lower portions of deeper gaps. The depth of the surface of the solution is adjusted so that after electroless plating the remaining gaps all have acceptably low aspect ratios. The other option to accomplish a partial filling of the deeper gaps is to spin-on the plating solution. By tuning the speed it can be arranged so that the surface of the solution is adjusted so that after electroless plating the remaining gaps all have acceptably low aspect ratios. Performing electroless plating with the solution the lower potions of the deeper gaps results in a partial copper filling of the deeper gaps. The thickness of copper thus formed by electroless plating should be large enough so that the aspect ratios associated with the remainders of the deeper gaps are small enough that pinhole like voids do not form when ECP is used to complete the filling. The ECP process is used to complete the copper filling. A blanket copper layer is thus formed over the wafer. A conventional annealing step is then performed to anneal the copper, in which a temperature of about 150° C. is usually used for duration of about 0.5 hours. A CMP step follows to planarize the surface, giving rise to the gaps now filled with copper separated by the dielectric layer.

While the invention has been particularly shown and described with reference to the preferred embodiments thereof, it will be understood by those skilled in the art that various changes in form and detail may be made without departing from the spirit and scope of the invention.

What is claimed is:

1. A method of filling an opening comprising:
   providing a substrate prepared with a dielectric layer with an opening with upper and lower portions, the opening having an aspect ratio;
   forming a metal barrier layer, the metal barrier layer lining the sides and bottom of the opening in the dielectric layer;
   forming a copper seed layer on the metal barrier layer;
   forming a non-conformal first copper layer in only the lower portion of the opening to partially fill the opening, wherein the first copper layer forms on the seed layer and includes a planar top surface, wherein the first copper layer reduces the aspect ratio of the opening;
   using ECP to form a second copper layer to fill the reduced aspect ratio opening, wherein the first and second fill processes are different types of fill processes, the second copper layer contacts the top surface of the first copper layer;
   annealing the substrate; and
   polishing the substrate to form a planar surface with the top of the opening.

2. A method of forming integrated circuits comprising:
   providing a substrate prepared with a dielectric layer having an opening with an aspect ratio, the opening includes upper and lower portions;
   forming a conductive seed layer to line sides of the upper and lower portions and bottom of the opening;
   forming a first conductive layer in a first fill process, wherein the first conductive layer forms only in the lower portion of the opening to partially fill the opening to reduce the aspect ratio of the opening, wherein the first conductive layer forms on sides and bottom of the seed layer in the lower portion of the opening and includes a planar top surface; and
   forming a second conductive layer in a second fill process to fill the reduced aspect ratio opening, wherein the second conductive layer contacts the first conductive layer.

3. The method of claim 2 wherein forming the first conductive layer in the first fill process comprises electroless plating with a solution which includes using water jet or spin on technology, wherein parameters of the electroless plating are tuned to form the first conductive layer in the lower portion of the opening.

4. The method of claim 2 wherein:
   the opening comprises a dual damascene opening which includes a via below a trench, the trench being wider than the via; and
   forming the first conductive layer in the first fill process comprises electroless plating with a solution which includes using water jet or spin on technology, wherein parameters of the electroless plating are tuned to form the first conductive layer in the lower portion of the opening to at least partially fill the via.

5. The method of claim 4 wherein the first conductive layer fills the lower portion of the opening to fill the via.

6. The method of claim 2 wherein the first and second conductive layers comprise copper.

7. The method of claim 6 wherein forming the second conductive layer comprises electroplating and forms the second conductive layer over the first conductive layer and filling the opening.

8. The method of claim 7 further comprises polishing to remove excess second conductive layer to provide a planar surface with the top of the opening.

9. The method of claim 2 wherein forming the second conductive layer comprises electroplating and forms the second conductive layer over the first conductive layer and filling the opening.

10. The method of claim 9 further comprises polishing to remove excess second conductive layer to provide a planar surface with the top of the opening.

11. A method of forming interconnects in an integrated circuit comprising:

providing a substrate prepared with an intermetal dielectric layer having an opening with upper and lower portions, the lower portion includes a via and the upper portion includes a trench, the opening having an aspect ratio;

forming a seed layer to line sides and bottom of the opening;

forming a first conductive layer in a first fill process by electroless plating, the first fill process forms the conductive layer only in the lower portion of the opening to partially fill the opening, wherein the first conductive layer forms on sides and bottom of the seed layer in the lower portion and includes a planar top surface, the partial fill reduces the aspect ratio of the opening; and forming a second conductive layer in a second fill process to fill the reduced aspect ratio opening.

12. A method of forming interconnects in an integrated circuit comprising:

providing a substrate prepared with a dielectric layer having a dual damascene opening with upper and lower portions, the dual damascene opening includes a via below a trench, wherein the trench is wider than the via, the dual damascene opening having an aspect ratio;

forming a seed layer to line sidewalls in the upper and lower portions and bottom of the dual damascene opening;

forming a first conductive layer in a first fill process, the first fill process forms the first conductive layer in only the lower portion of the dual damascene opening to partially fill the dual damascene opening, wherein the first conductive layer forms on sides and on bottom of the seed layer in the lower portion of the dual damascene opening and includes a planar top surface, the first fill process reduces the aspect ratio of the dual damascene opening; and forming a second conductive layer in a second fill process to fill the reduced aspect ratio dual damascene opening with conductive material, the second conductive layer contacts the planar top surface of the first conductive layer.

* * * * *